(12) United States Patent
Milke et al.

(10) Patent No.: US 9,966,355 B2
(45) Date of Patent: *May 8, 2018

(54) ALUMINUM COATED COPPER BOND WIRE AND METHOD OF MAKING THE SAME

(71) Applicant: Heraeus Materials Technology GmbH & Co. KG, Hanau (DE)

(72) Inventors: Eugen Milke, Nidderau (DE); Peter Prenosil, Hanau (DE); Sven Thomas, Frankfurt (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 680 days.

This patent is subject to a terminal disclaimer.

(21) Appl. No.: 14/399,351

(22) PCT Filed: May 7, 2013

(86) PCT No.: PCT/EP2013/059520
§ 371 (c)(1),
(2) Date: Nov. 6, 2014

(87) PCT Pub. No.: WO2013/167609
PCT Pub. Date: Nov. 14, 2013

(65) Prior Publication Data
US 2015/0155252 A1     Jun. 4, 2015

(30) Foreign Application Priority Data
May 7, 2012   (EP) .................................. 12003604

(51) Int. Cl.
*B32B 15/01* (2006.01)
*B21F 9/00* (2006.01)
(Continued)

(52) U.S. Cl.
CPC .............. *H01L 24/45* (2013.01); *B21F 9/005* (2013.01); *B23K 1/0016* (2013.01); *B32B 15/01* (2013.01);
(Continued)

(58) Field of Classification Search
None
See application file for complete search history.

(56) References Cited

U.S. PATENT DOCUMENTS

| | | | |
|---|---|---|---|
| 2004/0014266 A1* | 1/2004 | Uno | B21C 37/042 438/200 |
| 2007/0284415 A1* | 12/2007 | Hosseini | B23K 20/004 228/101 |
| 2010/0006318 A1* | 1/2010 | Elie | H01B 3/105 174/105 R |

FOREIGN PATENT DOCUMENTS

| | | |
|---|---|---|
| DE | 102006023167 B3 | 12/2007 |
| JP | S64-42138 A | 2/1989 |

OTHER PUBLICATIONS

Office Action dated Nov. 28, 2016 in JP Application No. 2015-510798.
(Continued)

*Primary Examiner* — Humera N Sheikh
*Assistant Examiner* — Xiaobei Wang
(74) *Attorney, Agent, or Firm* — Panitch Schwarze Belisario & Nadel LLP

(57) ABSTRACT

A wire, preferably a bonding wire for bonding in microelectronics, contains a copper core with a surface and coating layer containing aluminum superimposed over the surface of the copper core. The ratio of the thickness of the coating layer to the diameter of the copper core is from 0.05 to 0.2 μm. The wire has a diameter in the range of from 100 μm to 600 μm and specified standard deviations of the diameter of the copper core and of the thickness of the coating layer. The (Continued)

invention further relates to a process for making a wire, to a wire obtained by the process, to an electric device containing at least two elements and the wire, to a propelled device containing the electric device, and to a process of connecting two elements through the wire by wedge bonding.

16 Claims, 9 Drawing Sheets

(51) Int. Cl.
| | | |
|---|---|---|
| *B23K 1/00* | (2006.01) | |
| *C22C 9/00* | (2006.01) | |
| *C22C 21/00* | (2006.01) | |
| *H01L 23/00* | (2006.01) | |
| *H01B 1/02* | (2006.01) | |
| *C22F 1/04* | (2006.01) | |
| *C22F 1/08* | (2006.01) | |

(52) U.S. Cl.
CPC ............... *C22C 9/00* (2013.01); *C22C 21/00* (2013.01); *C22F 1/04* (2013.01); *C22F 1/08* (2013.01); *H01B 1/023* (2013.01); *H01B 1/026* (2013.01); *H01L 24/43* (2013.01); *H01L 24/48* (2013.01); *H01L 24/85* (2013.01); *H01L 2224/4312* (2013.01); *H01L 2224/43125* (2013.01); *H01L 2224/43848* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/45541* (2013.01); *H01L 2224/45565* (2013.01); *H01L 2224/45617* (2013.01); *H01L 2224/45624* (2013.01); *H01L 2224/4823* (2013.01); *H01L 2224/48091* (2013.01); *H01L 2224/48137* (2013.01); *H01L 2224/48227* (2013.01); *H01L 2224/48247* (2013.01); *H01L 2224/48472* (2013.01); *H01L 2224/48624* (2013.01); *H01L 2224/48724* (2013.01); *H01L 2224/48824* (2013.01); *H01L 2224/859* (2013.01); *H01L 2224/85205* (2013.01); *H01L 2224/85424* (2013.01); *H01L 2924/00011* (2013.01); *H01L 2924/00015* (2013.01); *H01L 2924/01015* (2013.01); *H01L 2924/01047* (2013.01); *H01L 2924/01322* (2013.01); *H01L 2924/1203* (2013.01); *H01L 2924/12041* (2013.01); *H01L 2924/12043* (2013.01); *H01L 2924/1304* (2013.01); *H01L 2924/1305* (2013.01); *H01L 2924/13055* (2013.01); *H01L 2924/14* (2013.01); *H01L 2924/181* (2013.01); *H01L 2924/2076* (2013.01); *H01L 2924/20303* (2013.01); *H01L 2924/20304* (2013.01); *H01L 2924/20305* (2013.01); *Y10T 428/1275* (2015.01)

(56) References Cited

OTHER PUBLICATIONS

Written Opinion dated Mar. 4, 2015 in SG Application No. 11201406479Q.
Int'l Search Report dated Jun. 24, 2013 in Int'l Application No. PCT/EP2013/059520.
Extended European Search Report dated Nov. 20, 2012 in EP Application No. 12003604.1.
Office Action dated Sep. 29, 2016 in CN Application No. 201380023792.8.

\* cited by examiner

ALUMINUM COATED COPPER BOND WIRE AND METHOD OF MAKING THE SAME

CROSS-REFERENCE TO RELATED APPLICATIONS

This application is a Section 371 of International Application No. PCT/EP2013/059520, filed May 7, 2013, which was published in the English language on Nov. 14, 2013 under International Publication No. WO 2013/167609 A1 and the disclosure of which is incorporated herein by reference.

BACKGROUND OF THE INVENTION

The invention relates to a wire, preferably for bonding in microelectronics, comprising a copper core with a surface and a coating layer comprising aluminum superimposed over the surface of the copper core. The ratio of the thickness of the coating layer to the diameter of the copper core is in the range of from 0.05 to 0.2 and the ratio of the standard deviation of the diameter of the copper core to the diameter of the copper core is in the range of from 0.005 to 0.05. The ratio of the standard deviation of the thickness of the coating layer to the thickness of the coating layer is in the range of from 0.05 to 0.4 and the wire has a diameter in the range of from 100 µm to 600 µm. The invention further relates to a process for making a wire, to a wire obtainable by the process, to an electric device comprising at least two elements and at least the wire, to a propelled device comprising the electric device, and to a process of connecting two elements through the wire by wedge-bonding.

Bonding wires are used in the manufacture of semiconductor devices for electrically interconnecting an integrated circuit and a printed circuit board during semiconductor device fabrication. Further, bonding wires are used in power electronic applications to electrically connect transistors, diodes and the like with pads or pins of the housing. While bonding wires were made from gold in the beginning, nowadays less expensive materials, such as copper or aluminum, are used. While copper wire provides very good electric and thermal conductivity, wedge-bonding of copper wire has its challenges compared to wires made of aluminum. Moreover, copper wires are susceptible to oxidation of the wire.

With respect to wire geometry, most common are bonding wires of circular cross-section and bonding ribbons, which have a more or less rectangular cross-section. Both types of wire geometries have their advantages, making them useful for specific applications. Thus, both types of geometry have their share in the market. For example, bonding ribbons have a larger contact area for a given cross-sectional area. However, bending of the ribbons is limited and orientation of the ribbon must be observed when bonding in order to arrive at acceptable electrical contact between the ribbon and the element to which it is bonded. Turning to bonding wires, these are more flexible to bending. However, bonding involves either soldering or larger deformation of the wire in the bonding process, which may cause harm or even destroy the bonding pad and underlying electric structures of the element which is bonded thereto.

Some recent developments were directed to bonding wires having a core and a shell, which is, for example, a coating layer. As core material, copper or gold may be chosen because of high electric conductivity. With regard to the coating layer, aluminum is one of the more common choices. These core-shell bonding wires combine some of the advantages of the copper wire and some of the aluminum wire. Recent achievements make using standard wedge-bonding processes for such aluminum coated copper wires possible. Nevertheless, there is an ongoing need for further improving bonding wire technology with regard to the bonding wire itself and the bonding processes.

BRIEF SUMMARY OF THE INVENTION

Accordingly, it is an object of the invention to provide improved wires.

Thus, it is another object of the invention to provide wire, which has good processing properties and which has no specific needs when interconnecting, thus saving costs.

It is also an object of the invention to provide wire which has excellent electrical and thermal conductivity.

It is a further object of the invention to provide wire which exhibits an improved reliability.

It is a further object of the invention to provide wire which exhibits excellent bondability.

It is another object of the invention to provide wire which has improved resistance to corrosion and/or oxidation.

It is another object to provide a novel wire to be used with standard chip and bonding technology, which novel wire assures extended lifetime over conventional wires.

It is a further object to provide improved electrical devices, in particular for power electronics, which have an extended lifetime compared to conventional devices in which the electrical elements are interconnected by standard aluminum wires.

It is another object to provide improved electrical devices, in particular for power electronics, which operate at higher electrical current flow than conventional devices in which bonding is based on aluminum wires.

It is another object of the invention to provide such improved electrical devices which have the same dimensions and similar chip design as aforementioned conventional devices. It is another object to provide means for manufacturing such improved electrical devices on production lines originally designed for the manufacture of conventional electrical devices. This would minimize cost for implementing the improved technology.

It is a further object to provide improved electrical devices in which the probability of unintended internal electrical bridging is reduced compared to conventional electrical devices. Further, it is an object to simplify, or even to be able to omit, particular precautions with regard to unintended internal bridging in electrical devices.

Surprisingly, wires of the present invention have been found to solve at least one of the objects mentioned above. Further, a process for manufacturing these wires has been found which overcomes at least one of the challenges of manufacturing wires. Further, semiconductors comprising the wires of the invention were found to be more reliable at the interface between the wire according to the invention and other electrical elements, such as the printed circuit board, the pad/pin etc.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
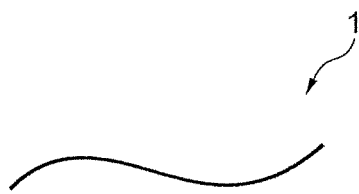
FIG. 1 depicts a wire 1.
Figure 2:
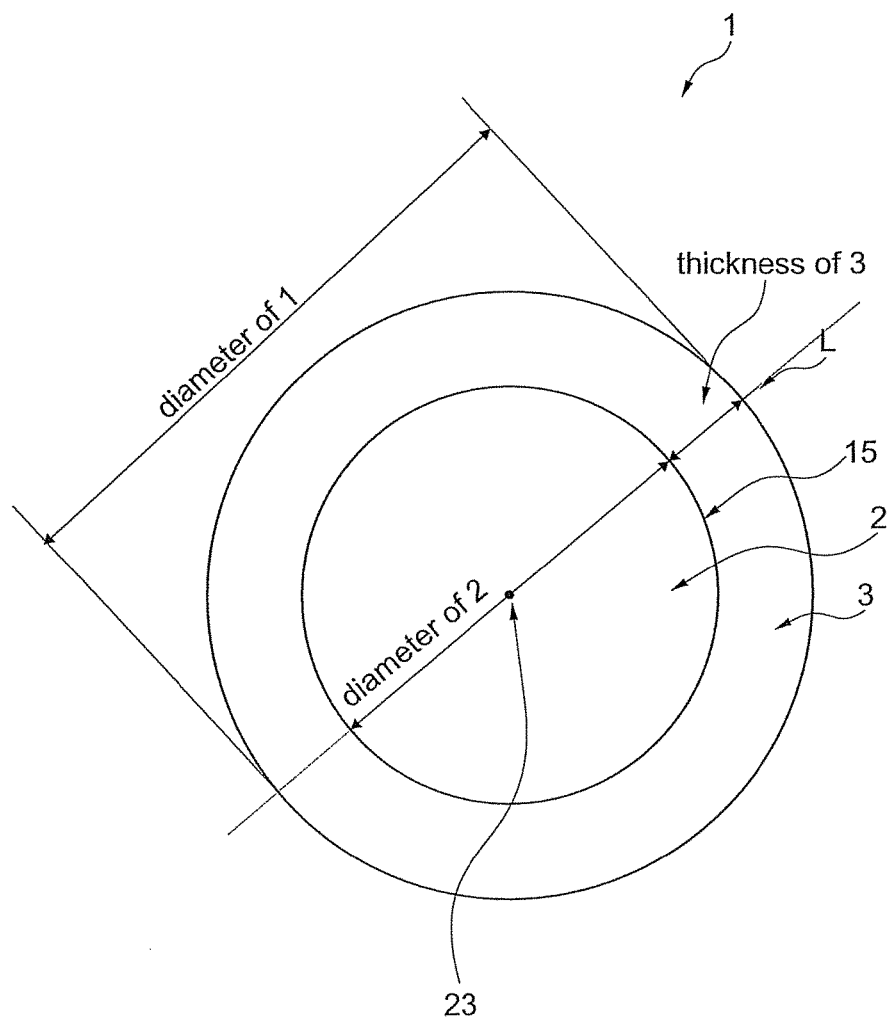
FIG. 2 shows a cross sectional view of wire 1. In the cross sectional view, a copper core 2 is in the middle of the cross sectional view. The copper core 2 is encompassed by a coating layer 3. On the limit of copper wire 2, a surface 15 of the copper core is located. On a line L through the center 23 of wire 1 the diameter of copper core 2 is shown as the end to end distance between the intersections of line L with the surface 15. The diameter of wire 1 is the end-to-end distance between the intersections of line L through the center 23 and the outer limit of wire 1. Besides, the thickness of coating layer 3 is depicted.
Figure 3:
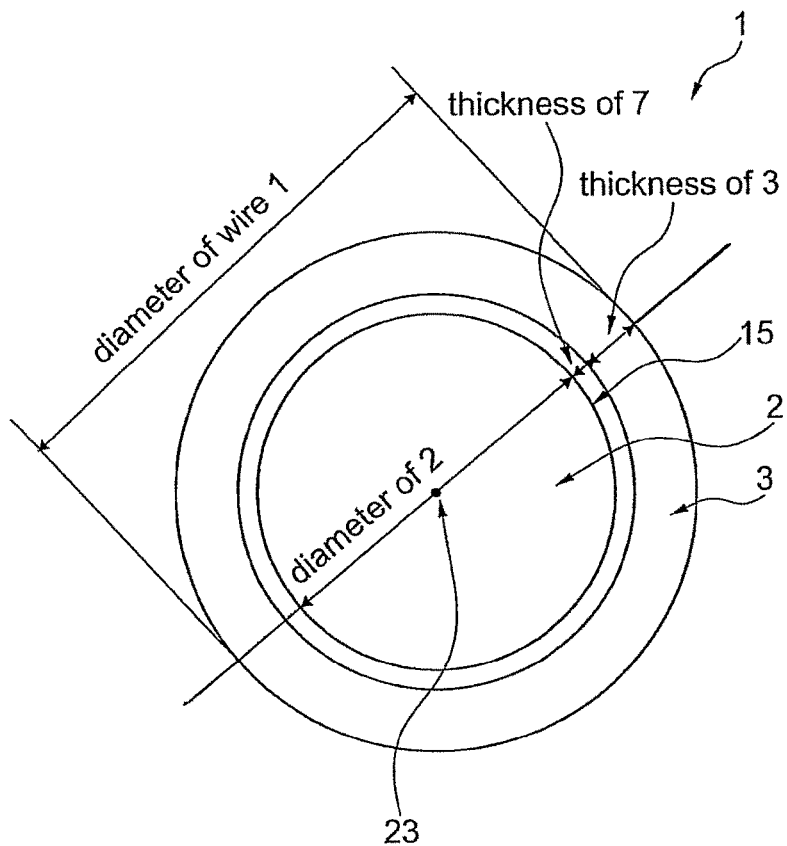
In FIG. 3, a wire 1 having a copper core 2, an intermediate layer 7 and a coating layer 3 is depicted. In addition to the items described for FIG. 2, the thickness of the intermediate layer 7 is shown.
Figure 4:
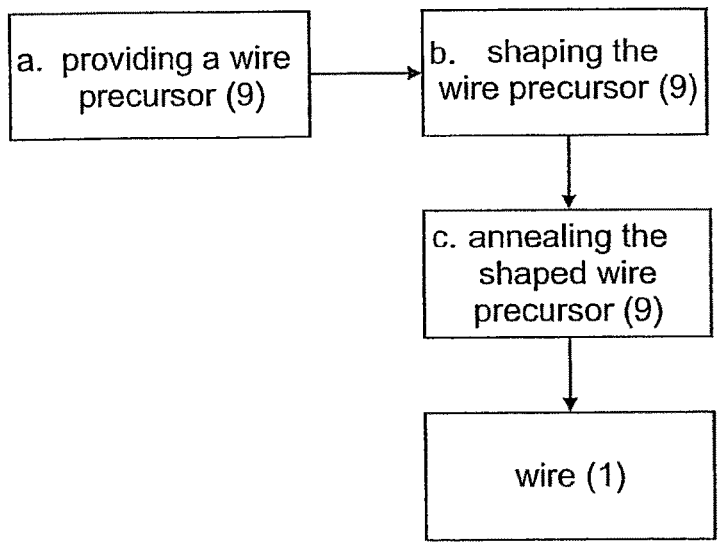
FIG. 4 shows a process according to the invention.
Figure 5:
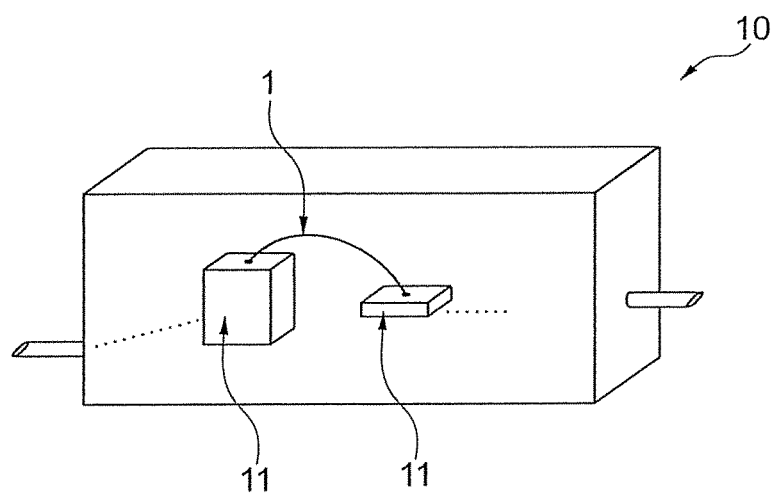
FIG. 5 depicts an electric device comprising two elements 11 and a wire 1. The wire 1 electrically connects the two elements 11.
Figure 6:
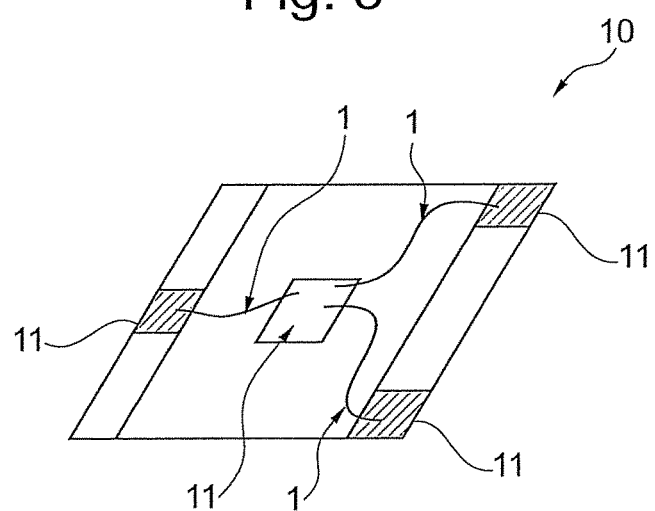
FIG. 6 depicts another electric device 10. Four elements 11 are electrically connected by three wires 1.
Figure 7:
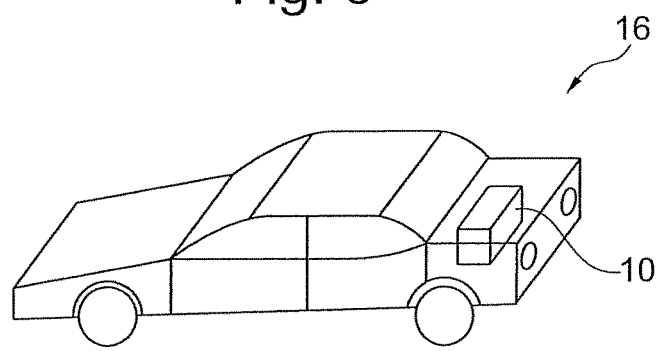
FIG. 7 depicts a propelled device 16, in this case a car, which comprises an electric device 10.
Figure 8:
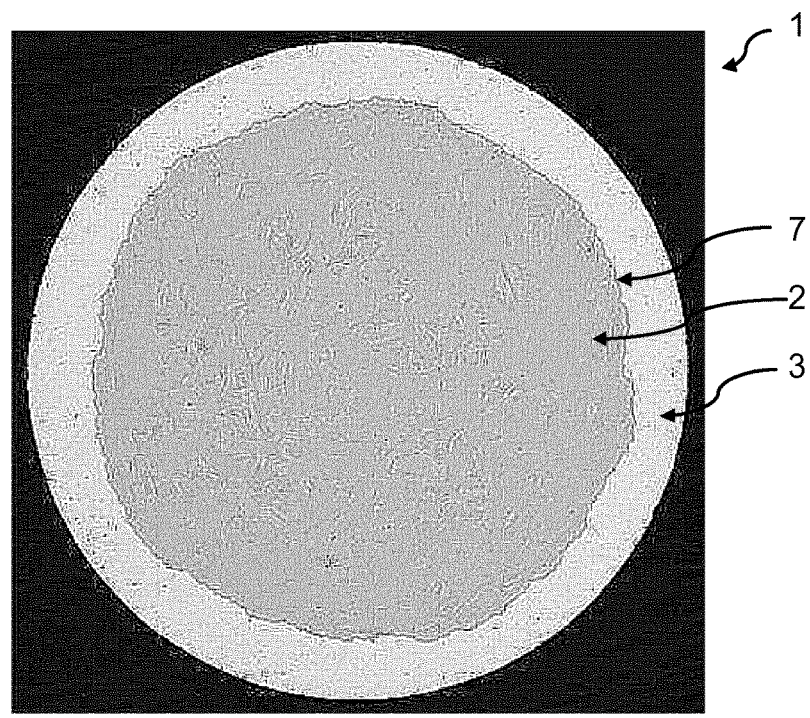
In FIG. 8 a cross sectional view of a piece of wire according to the invention is shown.
Figure 9:
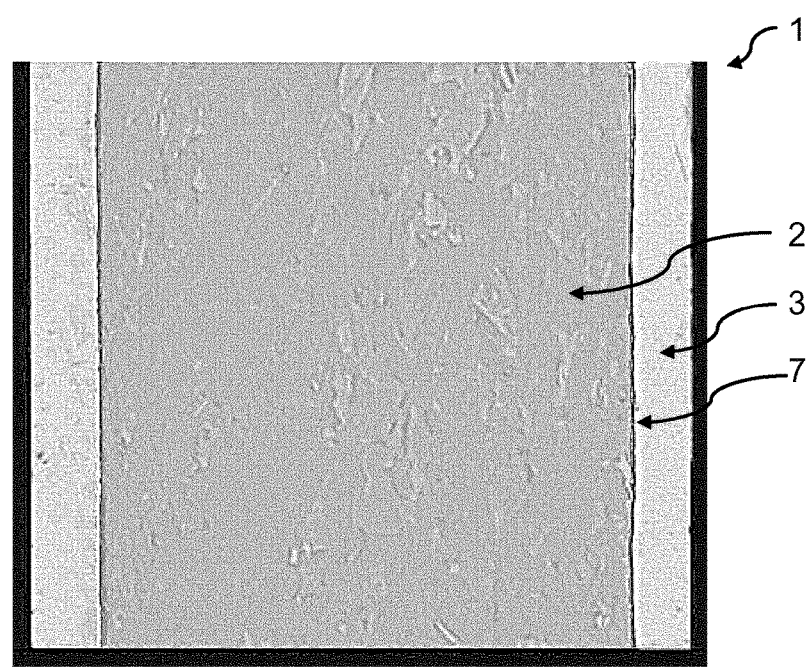
In FIG. 9, a longitudinal cut through a piece of wire according to the invention is shown.
Figure 10:
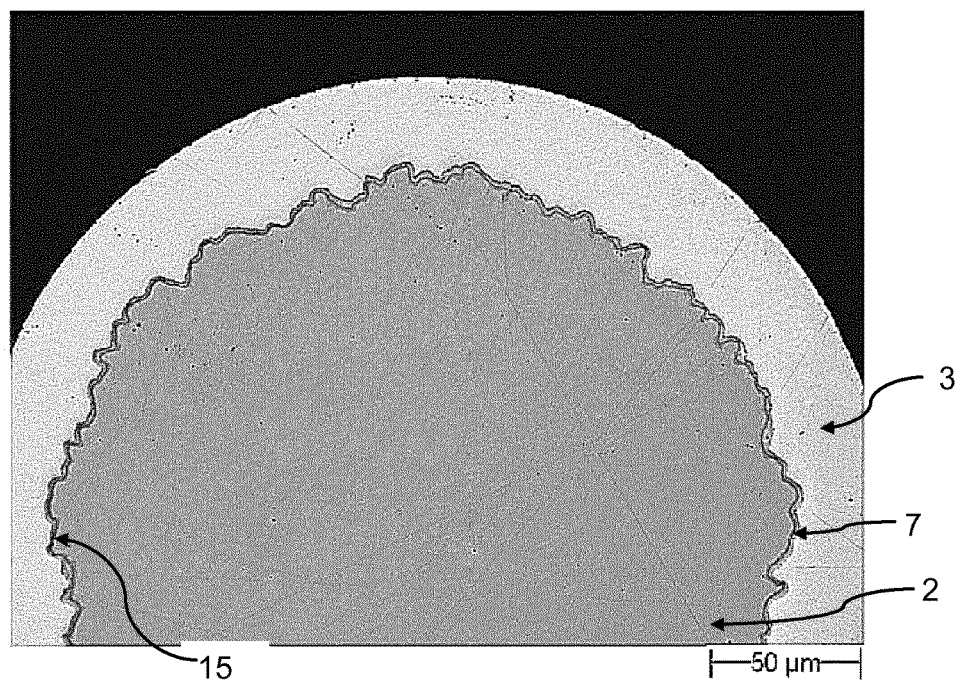
FIG. 10 depicts a magnification of a wire 1. From bottom to top are shown a section of a copper core 2 followed by an intermediate layer 7, between both the surface of the copper core 15. On top of the intermediate layer 7 is a coating layer 3. The black area on top, which is adjacent to coating layer 3, is background and not part of the example.
Figure 11:
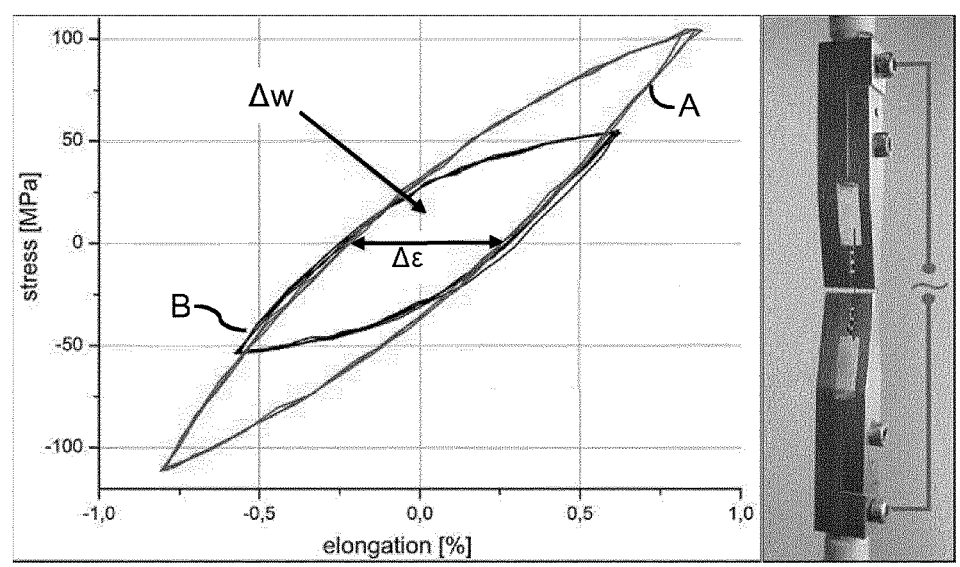
FIG. 11 depicts an exemplifying chart of the strain-uniaxial cyclic test. On the x axis, the elongation is shown in %. On the y axis, stress [MPa] is shown. The resulting curve from the experiment is a historesis loop. The curve marked with A was recorded by a wire according to the invention, curve B was recorded with a reference wire made from pure aluminum. $\Delta\epsilon_{pl}$ and $\Delta w$ are determined as described in the test method.
Figure 12:
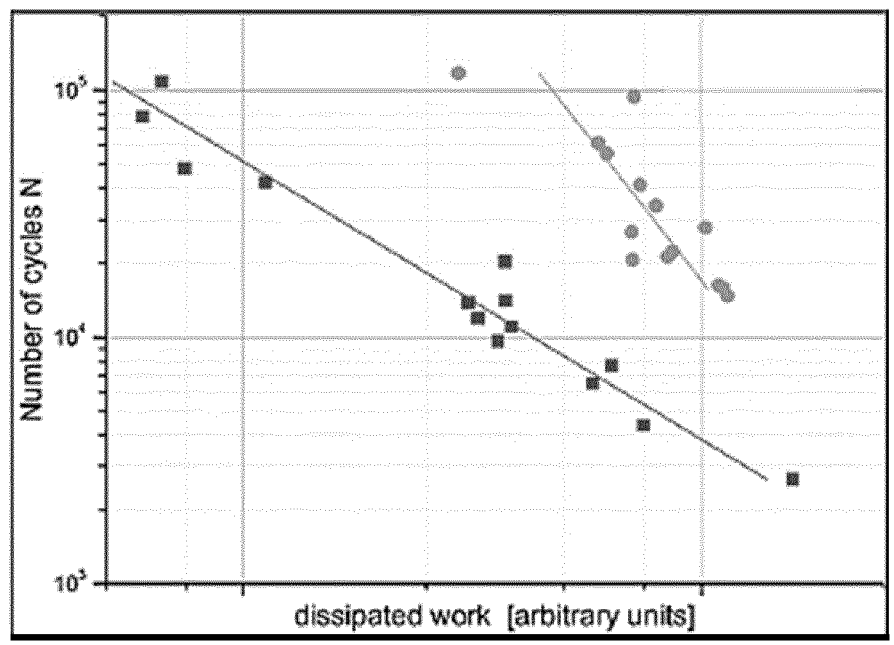
FIG. 12 and FIG. 13 show a plurality of measurements as described for FIG. 11 collecting the resulting for dissipated work in a chart in FIG. 12 and for plastic strain in FIG. 13. Values marked with round dots were recorded by a wire according to the invention and values marked with rectangular dots was recorded with a reference wire made from pure aluminum.
Figure 13:
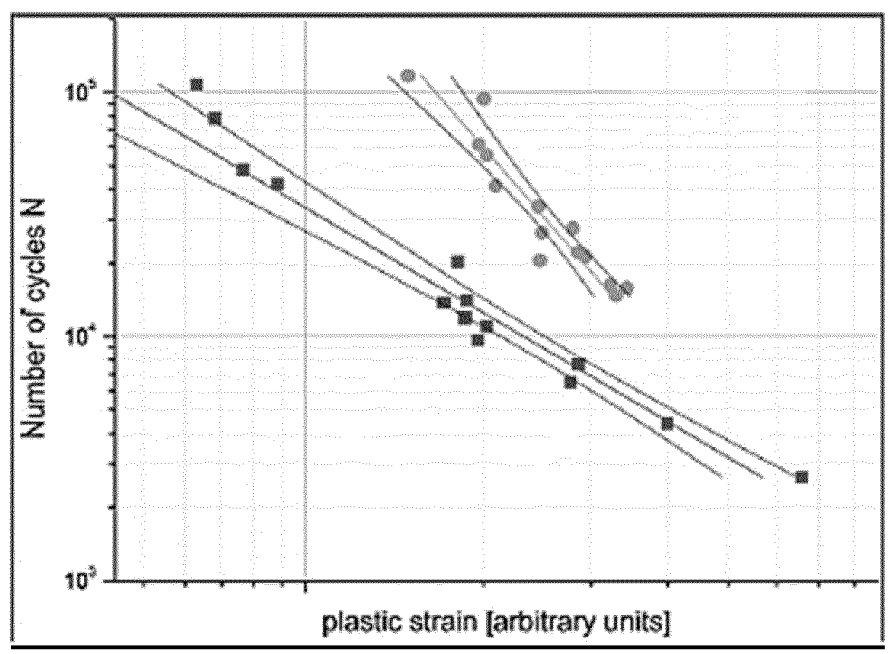
Figure 14:
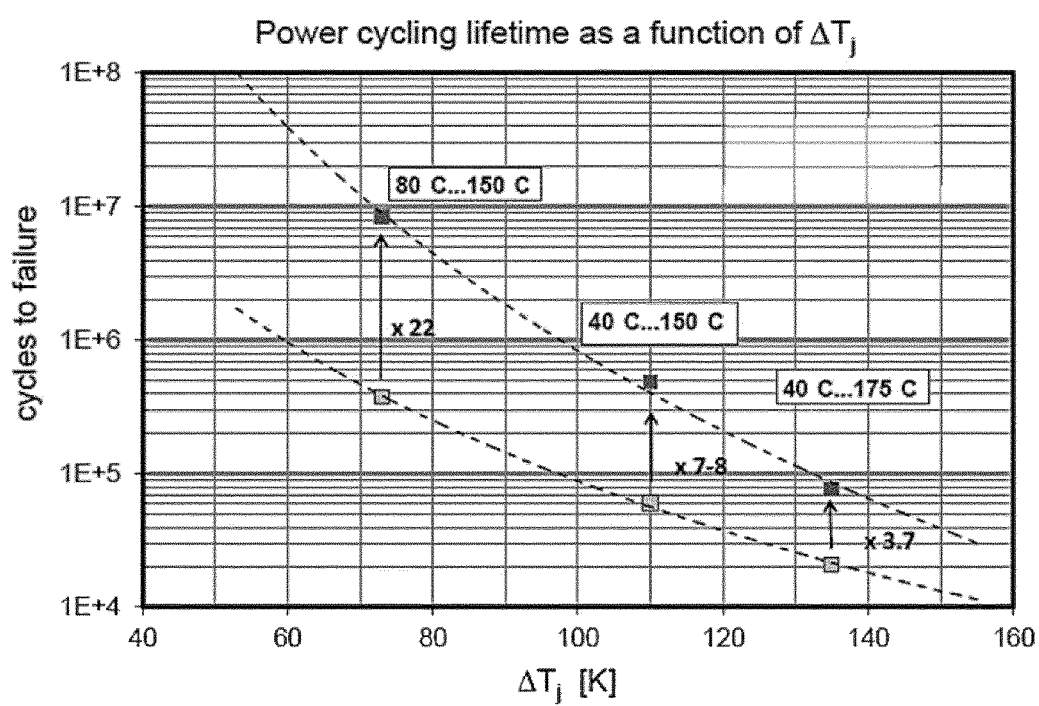
FIG. 14 shows a chart collecting the results of power cycling tests. On the x axis the $\Delta T$, which is the difference between the temperature at start of a cycle and at stop of a cycle, is shown. On the y axis the number of cycles until failure is shown. In this chart, a curve for a sample of pure aluminum is shown (curve fit through light rectangular dots). Further, a curve for wire according to the invention is shown (curve fit through dark rectangular dots). According to the chart the number of cycles to failure is for the wire of the invention at least three times as high as for a reference of pure aluminum.
Figure 15:
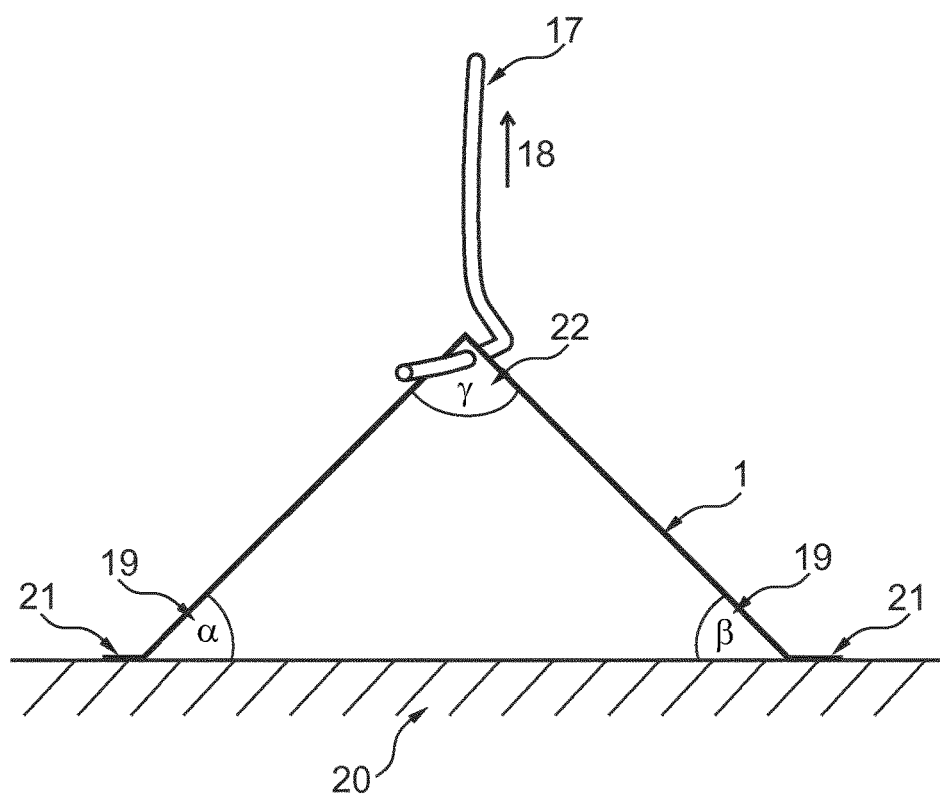
FIG. 15 shows a sketch of a wire pull test. To a substrate 20, a wire 1 is bonded in bonds 21 at an angle 19 of 45°. A pull hook 17 pulls wire 1. The angle 32, which is formed when the pull hook 17 pulls wire 1, is 90° C.

A first aspect of the invention is a wire comprising:
a copper core (2) with a surface (15); and
a coating layer (3) superimposed over the surface (15) of the copper core (2),
wherein the coating layer (3) comprises aluminum.

The ratio of the thickness of the coating layer (3) to the diameter of the copper core (2) is in the range of from 0.05 to 0.2, preferably from 0.05 to 0.15, or from 0.1 to 0.15.

The ratio of the standard deviation of the diameter of the copper core (2) to the diameter of the copper core (2) is less than 0.1, preferably less than 0.05, or less than 0.03, or from 0.03 to 0.001.

The ratio of the standard deviation of the thickness of the coating layer (3) to the thickness of the coating layer (3) is in the range of from 0.05 to 0.4 μm, preferably from 0.1 to 0.3.

The wire has a diameter in the range of from 100 μm to 600 μm, preferably in the range of from 150 μm to 550 μm, or from 230 μm to 500 μm.

The wire is preferably a bonding wire for bonding in microelectronics. The wire is preferably a one-piece object. The criteria for aforementioned cross-sectional view and the diameter should be met within at least 80%, preferably 90% of the longitudinal extension of the wire.

The term "a cross-sectional view" in the present context refers to a view of a cut through the wire, wherein the plane of the cut is perpendicular to the longitudinal extension of the wire. The cross-sectional view can be found at any position on the longitudinal extension of the wire The "longest path" through the wire in a cross-section is the longest chord which can be laid through the cross-section of the wire within the plane of the cross-sectional view.

The "shortest path" through the wire in a cross-section is the longest chord perpendicular to the longest path within the plane of the cross-sectional view defined above.

If the wire has a perfect circular cross-section, then the longest path and the shortest path become indistinguishable and share the same value.

The term "diameter" is the arithmetic mean of all geometric diameters of any plane and in any direction, wherein all planes are perpendicular to the longitudinal extension of the wire.

The term "superimposed" in the context of this invention is used to describe the relative position of a first item, such as a copper core, with respect to a second item, such as a coating layer. Possibly, further items, such as an intermediate layer, may be arranged between the first and the second item. Preferably, the second item is at least partially superimposed over the surface of the first item, for example, at least 30%, 50%, 70% or for at least 90% with respect to the total surface of the first item.

The term "thickness" in the context of this invention is used to define the size of a layer in perpendicular direction to the longitudinal axis of the copper core, which layer is at least partially superimposed over the surface copper core.

The term "intermediate layer" in the context of this invention is a region of the wire, between the copper core and the coating layer. In this region, material as in the core as well as material as in the coating layer is present in combination, for example, in form of at least one intermetallic phase.

The term "intermetallic phase" in the context of this invention is used to define a phase of two or more metals, wherein the different elements are ordered into different sites in the structure, which sites have distinct local environments and often a well-defined, fixed stoichiometry. This is a different than alloys, in which the different elements are randomly distributed.

All of aforementioned dimensions of length, e.g. thickness, diameter, longest path, and shortest path are determined in a cross-sectional view as defined above.

The "surface" of the copper core of a uncoated copper wire is the wire/air interface.

The "surface" of the copper core of a coated, possibly annealed wire is defined to be the virtual limit of the copper core around its center, which virtual limit is where the concentration of Cu deviates more than 9.9%-wt. from the concentration of Cu at the center of the wire, which center is defined by the intersection of the shortest and the longest path both as defined above.

Preferably, the wire of the invention has a substantially circular area in a cross-sectional view of the wire.

The copper core according to the invention comprises at least 95% by weight, preferably at least 98% by weight, each based on the total weight of the copper core, of elemental copper (Cu) of a purity of at least 99.9% Cu. Preferably, the purity of the copper core is at least 99.99%, or 99.999%, or 99.9999%.

The coating layer comprising aluminum is preferably selected from the group consisting of aluminum, aluminum alloys or a combination of the two.

Preferred aluminum is elemental aluminum (Al) with a purity of at least 99.9% Al. More preferably, the purity of aluminum is at least 99.99% Al, or 99.999% Al. Usually, such coating layers form a thin layer of aluminum oxide at the aluminum-air interface.

Preferably, the coating layer comprises at least 80% by weight, preferably at least 90% by weight, each based on the total weight of the coating layer, of aluminum with a purity of 99.9%, yet more preferably a purity of 99.99%.

Preferred examples of aluminum alloys are alloys with magnesium (AlMg) and alloys of aluminum with 1%-wt. of silicon (AlSil), based on the total amount of the alloy.

According to another aspect of the invention, the diameter of the copper core is in the range of from 70 to 500 μm, preferably from 150 to 400 μm, or from 200 to 300 μm, or from 230 to 250 μm, each determined in a cross-sectional view of the wire.

According to another aspect of the invention, the thickness of the coating layer is in the range of from 10 to 60 μm, preferably from 20 to 50 μm, preferably from 20 to 40 μm, or from 25 to 35 μm, each determined in a cross-sectional view of the wire. The aforementioned criteria for thickness of the coating layer should be met within at least 80%, preferably 90% of the longitudinal extension of the wire.

According to another aspect of the invention, an intermediate layer is arranged between the core and the coating layer. The intermediate layer preferably comprises at least one intermetallic phase comprising material of the core and material of the coating layer. The intermediate layer usually shows concentration gradients for each of the materials involved. An intermetallic phase is formed if both materials are metals.

According to a preferred aspect of the invention, the intermediate layer is arranged between the core and the coating layer, wherein the intermediate layer is adjacent to the copper core and adjacent to the coating layer.

The intermediate layer of the wire is defined to be the region of the wire between the copper core and the coating layer in which the concentration of Cu deviates more than 5%-wt., based on the total weight of the intermediate layer, from the concentration of Cu in the copper core, based on the total weight of the copper core, and in which the concentration of Al deviates more than 5%-wt., based on the total weight of the intermediate layer, from the concentration of Al in the coating layer, based on the total weight of the coating layer.

Aforementioned dimensions, i.e. the thickness of the coating layer, the thickness of the intermediate layer, and the diameter of the copper core can be determined in a cross-sectional view of the wire, such as by using light microscopy or scanning electron microscopy. In light microscopy, the copper core is colored in copper red, the coating layer is silvery and the intermediate layer is grey. The concentrations of copper and aluminum which were described above, can be determined using combined SEM/EDX. (Scanning electron microscopy/energy dispersive X-ray spectroscopy).

According to another aspect of the invention, the area share of the intermediate layer in any cross-sectional view of the wire is in the range of from 0.4 to 15%, preferably from 0.8 to 8.5%, each based on the total area of the cross-section of the wire.

According to another aspect of the invention, the thickness of the intermediate layer is in the range of from 0.1 to 5 μm, preferably from 0.5 to 3 μm. The aforementioned criteria for thickness of the intermediate layer should be met within at least 80%, preferably 90% of the longitudinal extension of the wire. Sometimes, deviations in the thickness of the intermediate layer may occur due to imperfections of the intermediate layer, such as pores.

According to another aspect of the invention, the standard deviation of the thickness of HI the intermediate layer is in the range of from 0.1 to 5 μm, preferably from 0.4 to 4 μm, or from 0.5 to 3 μm.

According to another aspect of the invention, the dissipated work is at least two times, preferably at least three times as high for a wire according to the invention than the dissipated work for a reference wire made from pure aluminum. Preferably, the dissipated work is at least two times, preferably at least three times as high for a wire according to the invention than the dissipated work for a reference wire made from pure aluminum in a testing cycle in the range of from 20,000 to 120,000 testing cycles. More preferably, the dissipated work is at least two times, preferably at least three times as high for a wire according to the invention than the dissipated work for a reference wire made from pure aluminum in all testing cycles in the range of from 20,000 to 120,000 testing cycles. In some cases, however, the dissipated work for a wire according to the invention is not more than ten times as high as the dissipated work of a reference wire made from pure aluminum. This reference wire is an aluminum wire made from aluminum with a purity of 99.999% which is doped with 50 ppm nickel (sold by Heraeus/Germany under "AL-H11 CR") and which has the same cross-sectional area as the wire of the invention.

According to another aspect of the invention, the maximum strain is at least 1.5 times, preferably at least two times as high for a wire according to the invention than the maximum strain for a reference wire made from pure aluminum. Preferably, the maximum strain is at least two times, preferably at least four times as high for a wire according to the invention than the maximum strain from a reference wire made from pure aluminum in a testing cycle in the range of from 20,000 to 120,000 testing cycles. More preferably, the maximum strain is at least 1.5 times, preferably at least two times as high for a wire according to the invention than the maximum strain for a reference wire made from pure aluminum in all testing cycles in the range of from 20,000 to 120,000 testing cycles. In some cases, however, the maximum strain for a wire according to the invention is not more than ten times as high than the maximum strain of a reference wire made from pure aluminum. This reference wire is an aluminum wire made from aluminum with a purity of 99.999% which is doped with 50 ppm nickel (sold by Heraeus/Germany under "AL-H11 CR") and which has the same cross-sectional area as the wire of the invention.

According to another aspect of the invention the number of cycles under same conditions in the power cycling test is at least three times, preferably at least four times as high for a wire according to the invention than the power cycling test for a reference wire made from pure aluminum in a testing cycle in the range of from 20,000 to 120,000 testing cycles. More preferably, the number of cycles under same conditions in the power cycling test is at least three times, preferably at least four times as high for a wire according to the invention than the power cycling test for a reference wire made from pure aluminum in all testing cycles in the range of from 20,000 to 120,000 testing cycles. In some cases, however, the number of cycles under same conditions in the power cycling test is not more than 50 times as high than the dissipated work of a reference wire made from pure aluminum. This reference wire is an aluminum wire made from aluminum with a purity of 99.999% which is doped with 50 ppm nickel (sold by Heraeus/Germany under "AL-H11 CR") and which has the same cross-sectional area as the wire of the invention.

According to another aspect of the invention, the wire bond shear of the wire is at least as high for a wire according to the invention as for a reference wire made from pure aluminum. This test is described below. This reference wire is an aluminum wire made from aluminum with a purity of 99.999% which is doped with 50 ppm nickel (sold by Heraeus/Germany under "AL-H11 CR") and which has the same cross-sectional area as the wire of the invention.

According to another aspect of the invention, the wire pull of the wire is at least 10% higher, preferably at least 20% higher for the wire than for a reference wire made from pure aluminum. This reference wire is an aluminum wire made from aluminum with a purity of 99.999% which is doped with 50 ppm nickel (sold by Heraeus/Germany under "AL-H11 CR") and which has the same cross-sectional area as the wire of the invention.

According to another aspect of the invention, the wire of this invention meets at least two or even all of the aforementioned test conditions, i.e., dissipated work, maximum strain, power cycling test, wire bond shear and wedge pull.

Another aspect of the invention is a process for manufacturing a wire, comprising at least the following steps:
 a. providing a wire precursor comprising a copper core with a surface and a coating layer superimposed over the surface of the copper core, wherein the coating layer comprises aluminum,
  wherein the ratio of the thickness of the coating layer to the diameter of the copper core is in the range of from 0.05 to 0.2, preferably from 0.05 to 0.15, or from 0.1 to 0.15,
  wherein the ratio of the standard deviation of the diameter of the copper core to the diameter of the copper core is less than 0.1, preferably less than 0.05, or less than 0.03, or from 0.03 to 0.001,
  wherein the ratio of the standard deviation of the thickness of the coating layer to the thickness of the coating layer is in the range of from 0.05 to 0.4 µm, preferably from 0.1 to 0.3,
  wherein the wire precursor has a diameter in the range of from 0.5 to 5 mm,
 b. shaping the wire precursor, and
 c. annealing the wire precursor to obtain the wire.

The wire has a diameter in the range of from 100 µm to 600 µm, preferably in the range of from 150 µm to 550 µm, or from 230 µm to 500 µm.

A wire precursor as in step a. can be obtained by forming an aluminum coating layer on at least part of the surface of the copper wire. Preferably the aluminum layer is formed on 100%, or from 80 to 100%, or from 60 to 80%, of the surface of the copper wire, each with respect to the total surface area of the copper wire. Numerous techniques for forming an aluminum layer on a copper surface and in particular on copper wire are known. Preferred techniques are plating, such as electroplating and electroless plating, deposition of aluminum from the gas phase such as sputtering, ion plating, vacuum evaporation and chemical vapor deposition, and deposition of aluminum from the melt.

Pretreatment of the copper wire can be employed to adapt the surface roughness and/or to add a pattern to the surface of the copper wire. Numerous techniques are known to adapt the surface of the copper wire. Preferred techniques are cold roll forming, grinding and electrochemical grinding.

Numerous techniques are known to shape the wire precursor. Preferred techniques are rolling, swagging, die drawing or the like, of which die drawing is particularly preferred. More preferably, the wire precursor is drawn in 3 to 20 steps, wherein in each step an elongation of the wire precursor of from 6 to 18% in length is performed. A slipping agent may be employed. Suitable slipping agents are numerous and known to the skilled person.

Numerous procedures are known in the art to anneal a wire, e.g. annealing of wire can be performed in both a continuous or in a discontinuous process. In special applications, continuous and discontinuous processes may even be combined.

According to a preferred aspect of the invention, the annealing is performed by heating the wire precursor to a temperature in the range of from 140 to 400° C., preferably from 160 to 350° C., or from 200 to 300° C., or from 220 to 280° C. and the temperature is maintained for 30 minutes to 5 hours, preferably from 30 minutes to 3 hours. Then, the wire obtained by annealing the wire precursor is cooled to room temperature. The cooling can be performed in various ways. One suitable way is to expose the wire to ambient air at ambient temperature upon leaving the heating zone. The cooling of the wire to room temperature (T=20° C.) according to aforementioned procedure can be usually achieved within 24 hours. A quenching of the wire should be avoided, such as by immersion in cold water and the like. Accordingly, another aspect is a process in which the cooling of the wire upon leaving the heating zone is not performed by quenching of the wire.

According to another aspect of the invention the annealing is performed in a continuous process, more preferably in a tube furnace. Even more preferably, the wire is drawn from the step of providing a wire precursor and the shaping and the annealing by a single drawing machine.

Drawing speed during annealing in a tube furnace depends on the length of the tube of the tube furnace. As longer the tube, as higher drawing speeds are feasible in order to obtain a certain exposure of energy to a piece of wire. Preferred lengths of tubes of tube furnaces are in the range of from 0.8 to 2.5 meter, or from 1 to 2 meter, or from 1.5 to 2.5 meter.

The temperature in the tube of the furnace can be adjusted to the drawing speed, or evaluated independently. Preferred temperatures in the tube are in the range of from 150 to 600° C., or from 200 to 600° C., or from 250 to 550° C. In general, the temperature is selected to be lower than the temperature at which at least one of the components or a mixture of at least two components present in the wire liquefies. For example, if partially soluble or insoluble two- or multi-components alloys are annealed, the eutectic temperature of the alloy should not be exceeded by the temperature in the oven.

According to another aspect of the invention, the temperature in the furnace is chosen to be at least 30° C., or 50° C., or 80° C. lower than the temperature at which at least one of the components or a mixture of at least two components of the wire liquefies.

According to another aspect of the invention the annealing speed is chosen in the range of from 1 to 20 meter/min., or from 1 to 16 meter/min., or from 2 to 18 meter/min.

According to another aspect of the invention, the annealing in the tube furnace may be performed in an inert atmosphere or a reducing atmosphere. This applies to both annealing in continuous and discontinuous processing. Numerous inert atmospheres, as well as reducing atmospheres, are known in the art. Of the known inert atmospheres, nitrogen is preferred. Of the known reducing atmospheres, hydrogen is preferred. Further, preferred reducing atmospheres are mixtures of nitrogen and hydrogen. Preferably, mixtures of nitrogen and hydrogen are preferred which are in the range of from 90 to 98%-Vol. nitrogen and of from 10 to 2 Vol-% hydrogen, each referring to the total volume of the mixture. Preferred mixtures of nitrogen/hydrogen are equal to 93/7, 95/5 and 97/3 Vol-%/Vol-%, each based on the total volume of the mixture. Applying reducing atmospheres in annealing is particularly preferred if some parts of the surface of the wire are sensitive to oxidation by oxygen of the air, e.g., if copper of the wire is exposed to its surface.

According to another aspect of the invention, an intermediate layer is formed during annealing.

Another aspect of the invention is a wire obtained by a process defined above.

According to another aspect of the invention, the wire is characterized by at least one of the following features:

the dissipated work is at least two times as high for the wire according to the invention than the dissipated work for a reference wire made from pure Al;

the maximum strain in a uniaxial cyclic test is at least two times as high for the wire according to the invention than the maximum strain for a reference wire made from pure Al;

the power cycling test is at least three times as high for the wire according to the invention than for a reference wire made from pure Al;

the wire bond shear of the wire according to the invention is as high for the wire as for a reference wire made from pure Al;

the wire pull of the wire according to the invention is at least 10%, preferably at least 20%, higher for the wire than for a reference wire made from pure Al;

the electrical conductivity of the wire according to the invention is 20% to 55% higher than the electrical conductivity of a reference wire made from pure Al.

The reference wire made from pure Al mentioned above is an aluminum wire made from aluminum with a purity of 99.999% which is doped with 50 ppm nickel (sold by Heraeus/Germany under "AL-H11 CR") and which has the same cross-sectional area as the wire of the invention.

Another aspect of the invention is an electric device comprising two elements and at least a wire as defined above or a wire manufactured as described above.

According to another aspect of the invention, at least one wire in the electric device is connected to another element of the electric device by wedge bonding, preferably by ultrasonic wedge bonding.

According to another aspect of the invention, at least one of the elements is selected from the group consisting of a substrate, an IGBT (i.e., a insulated gate bipolar transistor), an integrated circuit, a transistor, or a diode, such as a light emitting diode or a photo diode.

Another aspect of the invention is a use of the wire described above or of wire manufactured according to a process as described above in wedge-wedge bonding interconnections between a control unit and a controlled device.

Another aspect of the invention is a propelled device, preferably a propelled vehicle, a solar cell or a wind turbine, which propelled device comprises at least one electric device as described above.

Another aspect of the invention is a process for making an electric device comprising the steps of a. providing at least two elements; and b. connecting the two elements through a wire as described above, wherein at least one of the connections is performed by wedge bonding.

Wedge bonding technology is known in the art and extensively described in the literature, e.g. in Shankara K. Prasad, "Advanced Wirebond Interconnection Technology", Kluwer Academic Publishers, 2004, ISBN 1-4020-7762-9, in particular chapter I (introduction) and chapter IV (process technology).

Test Methods

All tests and measurements were conducted at T=20° C. and a relative humidity of 50%.

Electrical Conductivity

Both ends of a test specimen, i.e., a wire of 1.0 m in length, were connected to a power source providing a constant current of I=10 mA. The voltage was recorded with a device for measuring voltage. This set-up was repeated with at least four test specimens. The arithmetic mean of the four measurements was used for the calculations given below.

The resistance R was calculated according to $R=U/I$.

The specific resistivity $\rho$ was calculated according to $\rho=(R \times A)/l$, wherein A is the mean cross-sectional area of the wire and l the length of the wire between the two measuring points of the device for measuring voltage.

The specific conductivity $\sigma$ was calculated according to $\sigma=1/\rho$.

Layer Thickness

For determining the thickness of the coating layer, the thickness of the intermediate layer and the diameter of the core, the wire was cut perpendicular to the maximum elongation of the wire. The cut was carefully grinded and polished to avoid smearing of soft materials such as Al. A picture was recorded through an optical microscope or a scanning electron microscope (SEM), wherein the magnification was chosen so that the full cross-section of the wire was shown.

This procedure was repeated at least 15 times. All values are provided as arithmetic mean of the at least 15 measurements.

Wedge-Wedge Bonding—Parameter Definition

Bonding of a wire to a substrate made of CuSn6 plated with AlSil (available from Heraeus/Germany) was performed at 20° C., wherein the bonding was applied to the AlSil surface. After forming a first wedge bond with an angle of 45° between the wire and the substrate, the wire was wedged with its second end to the substrate. The distance of the bonds between the two ends of the wire was in the range of from 5 to 20 mm. This distance was selected in order to assure the angle of 45° between the wire and the substrate. During wedge bonding, ultrasonic sound of a frequency in the range of 60-120 kHz was applied to the bond tool for 40 to 500 milliseconds.

Then, reference samples of standard wire made from aluminum AL-H11 CR were wedge bonded as described above. The extent of deformation of the bonded wire was evaluated by determining the area of the contact of the wire on the substrate ($A_{c\ ref}$).

Regarding the samples to be tested which are made using a wire according to the invention, the wedge bonding parameters, i.e., applied force, frequency and time of exposure to ultrasonic sound, must be adapted to achieve an area of contact of the wire according to the invention on the substrate ($A_{c\ inv}$), wherein $A_{c\ ref}$ equals $A_{c\ inv}$. With regard to copper wire having a coating layer comprising aluminum, the applied energy must be increased, i.e., one of the parameters: applied force, frequency of ultrasonic sound and length of exposure to ultrasonic sound must be increased.

Wire Pull

Wire pull tests were conducted according to MIL-STD-883G Method 2011.7 (1989), Condition D on a XYZTEC Condor 150 machine. The wire was bonded onto an aluminum substrate made of CuSn6 plated with AlSil (available from Heraeus/Germany) at an angle of 45°, wherein the bonding was applied to the AlSil surface. The distance of the bonds between the two ends of the wire were in the range of from 5 to 20 mm. This distance was selected in order to assure the angle of 45° between the wire and the substrate. The loop was pulled in the middle of the loop at a pull speed of 2,500 µm/s. The diameter of the pull hook was at least twice the diameter of the wire.

Wire Bond Shear Test

Wire bond shear tests were conducted according to AEC-Q101-003 Rev-A (07.2005) on a XYZTEC Condor 150 machine. The wire was bonded to an aluminum substrate made of CuSn6 plated with AlSil (available from Heraeus/Germany) at an angle of 45°, wherein the bonding was applied to the AlSil surface. Then, the shear tool was lowered to the substrate at a speed of 50 µm/s to define zero height. Next, the shear tool was retracted from the substrate to a distance of 10% of the diameter of the bonded wire. Then, shearing was conducted at a rate of 250 µm/s. The bond shear failure mode was also recorded: (1) bond lifting; (2) bond shearing; (3) cratering; (4) bonding surface lifting (separation of the bonding surface from its underlying substrate).

Strain and Dissipated Work—Uniaxial Cyclic Test

A sample of straight wire was clamped in a machine to apply mechanical strain (tension and compression). The length of wire exposed to mechanical testing is 1.0 mm. Cycling of the sample was performed at a strain rate of 1%/s until failure of the sample (breakage of wire). The machine recorded the force transmitted by the sample. The plastic strain amplitude ($\Delta\epsilon_{pl}$) and the dissipated work ($\Delta w$) are each plotted versus number of cycles (N) until failure.

$\Delta\epsilon_{pl}$ is defined as strain difference at zero stress of increasing and decreasing branches of hysteresis loop.

$\Delta w$ is defined as the integral of one hysteresis loop.

Power Cycling Test

Samples were produced by wedge bonding a diode EMCON 4 High Power Chip (available from INFINEON Technologies AG, Munich, Germany) to a base plate using the wire to be tested. As described above, wedge bonding parameters were chosen in a suitable way, assuring that all bonded wires show the same area of contact between the wire and the base plate ($A_{c\ ref}$). Of the commercially available base plates, a base plate was chosen that will retain the die attached (the diode) during the test. All samples were prepared using identical base plates.

Power cycling tests were conducted on a ITC5230 supplied from Integrated Technology Corporation, Tempe, Ariz. 85281, USA. For testing, a sample was mounted on a cooling pad through which the sample was permanently cooled at constant flow rate using a fluid having a temperature 20° C. at the inlet of the cooling pad. To assure a defined transfer of heat dissipated by the sample, a heat conducting film was arranged between the sample and the cooling pad. The electrodes of ITC5230 were contacted to the diode and to the base plate.

Prior to the power cycling test, the amount of electrical current ($I_0$) at a preset voltage ($V_0$) and the time were evaluated, which are necessary to effect an increase in temperature to 175° C. of the sample from a starting temperature of 40° C. This time is the ON-time of a cycle. After that, the cooling time of the sample to cool down from 175° C. to 40° C. was evaluated, while no electrical current was applied to the sample. This time is the OFF-time. A sequence of one ON-time followed by one OFF-time defines one power cycle.

Then, the power cycling test performed by continuously applying aforementioned power cycles. At preset electrical current $I_0$, the voltage ($V_t$) during ON-time of a power cycle was recorded. The power cycling test was finished, when the voltage $V_t$ during an ON-time period exceeded the voltage $V_f$. $V_f=(V_0+10\%)$.

Electrical Defects after Bonding

A set of 150 samples made under identical conditions according to the wedge-wedge bonding procedure described above were evaluated for electrical defects. Each of the samples has nine bonds, which adds up to 1350 bonds in total. Depending on the number of defects, each set was flagged with ++, +, 0, − or − − (see Table 2) as follows:

++=0
+=<2%
0=2-5%
−=5-10%
− −=>10%.

EXAMPLES

The invention is further exemplified by examples. These examples serve for exemplary elucidation of the invention and are not intended to limit the scope of the invention or the claims in any way.

Examples 1-15

A wire of overall diameter 1 mm wire having an aluminum coating of thickness 115 µm and a diameter of the copper core 770 µm was elongated using 22 drawing dies, each providing an elongation of 12% to obtain a wire of the wire diameter detailed in Example 2, Table 1. Then, the elongated wire was put on a roll and annealed in an oven for 1 hour at the annealing temperature T detailed in Table 1. After the annealing, the wire was cooled to ambient temperature was within 24 hours. The properties of these wires and the processing parameters of the wire treatment are collected in Table 1, the experimental data in Table 2 below. Examples 1, 3-15 were prepared using wires with Cu diameter and overall wire diameter as shown in Table 1.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

TABLE 1

Physical Properties and Process Parameters

| Example No. | Precursor copper core diameter [μm] | Precursor Overall wire diameter [μm] | Annealing Temperature T [° C.][1] | Thickness intermediate layer mean [μm] | Thickness intermediate layer stddev [μm] | Thickness coating layer mean [μm] | Thickness coating layer stddev [μm] | Cu diameter[2] mean [μm] | wire diam. mean [μm] | Al [area-%] calculated | Cu [area-%] measured |
|---|---|---|---|---|---|---|---|---|---|---|---|
| 1 | 758 | 1000 | 180 | 1.9 | 2.4 | 34.1 | 4.5 | 225.5 | 297.6 | 40.6 | 57.4 |
| 2 | 770 | 1000 | 220 | 2.1 | 2.5 | 32.1 | 5.1 | 229.4 | 298.1 | 38.5 | 59.2 |
| 3 | 780 | 1000 | 280 | 1.9 | 2.3 | 30.8 | 4.8 | 232.1 | 297.4 | 37.1 | 60.9 |
| 4 | 755 | 1000 | 360 | 4.7 | 2.2 | 31.8 | 3.9 | 224.7 | 297.6 | 38.2 | 57.0 |
| 5 | 829 | 1000 | 180 | 1.3 | 1.4 | 25.0 | 6.8 | 248.4 | 299.7 | 30.6 | 68.7 |
| 6 | 815 | 1000 | 220 | 1.9 | 1.7 | 26.1 | 5.0 | 244.5 | 300.0 | 31.8 | 66.4 |
| 7 | 813 | 1000 | 280 | 2.4 | 3.0 | 25.5 | 4.7 | 243.3 | 299.1 | 31.2 | 66.2 |
| 8 | 811 | 1000 | 360 | 3.8 | 2.6 | 24.6 | 4.6 | 242.8 | 299.5 | 30.2 | 65.7 |
| 9 | 816 | 1000 | 180 | 0.2 | 0.7 | 27.5 | 3.5 | 245.3 | 300.7 | 33.3 | 66.6 |
| 10 | 813 | 1000 | 220 | 0.1 | 0.5 | 28.1 | 3.7 | 245.2 | 301.7 | 33.8 | 66.1 |
| 11 | 809 | 1000 | 280 | 0.0 | 0.0 | 28.9 | 4.7 | 245.1 | 302.8 | 34.5 | 65.5 |
| 12 | 791 | 1000 | 360 | 2.8 | 0.7 | 28.8 | 3.0 | 238.9 | 302.1 | 34.5 | 62.6 |
| 13 | 612 | 1000 | 220 | 2.0 | 2.3 | 57.4 | 4.8 | 184.2 | 300.8 | 61.7 | 37.5 |
| 14 | 676 | 1000 | 220 | 2.0 | 2.5 | 47.3 | 5.0 | 202.8 | 300.1 | 53.1 | 45.7 |
| 15 | 966 | 1000 | 220 | 2.1 | 1.8 | 4.8 | 2.3 | 289.1 | 299.3 | 6.3 | 93.3 |
| 16 | 758 | 1000 | 220 | 2.0 | 2.1 | 13.9 | 3.8 | 270.0 | 299.1 | 17.8 | 81.5 |
| Al-H11CR[3] | | 1000 | 180 | | | | | | 300 | 100.0 | 0 |
| Al-H11 | | 1000 | 180 | | | | | | 300 | 100 | 0 |

[1]Annealing Time: 1 hour
[2]diameter of the copper core
[3]AlH11-CR and AlH11 are commercial samples of aluminum wire available from Heraeus/Germany

TABLE 2

| Example No. | Specific conductivity [m/Ω * mm2] | Wire pull [cN] | 1st wire bond shear[4] [cN] | 2nd wire bond shear[4] [cN] | uniaxial cycling plastic strain 0.25% [Cycles to failure] | uniaxial cycling plastic strain 0.20% [Cycles to failure] | uniaxial cycling plastic strain 0.15% [Cycles to failure] | Power Cycling delta T = 70 K [Cycles to failure] | Power Cycling delta T = 135 K [Cycles to failure] | Electrical defects of chips after bonding |
|---|---|---|---|---|---|---|---|---|---|---|
| 1 | 48.0 | 1394.0 | 1107.4 | 1135.7 | | | | | | + |
| 2 | 48.2 | 1342.1 | 1270.0 | 1415.9 | | | | | | + |
| 3 | 48.0 | 1293.1 | 1354.2 | 1472.4 | | | | | | 0 |
| 4 | 46.9 | 1038.3 | 1031.1 | 1104.5 | | | | | | + |
| 5 | 49.2 | 1225.5 | 739.5 | 1042.9 | | | | | | − |
| 6 | 49.6 | 1309.4 | 1153.0 | 1345.8 | | | | | | + |

TABLE 2-continued

| Example No. | Specific conductivity [m/Ω * mm2] | Wire pull [cN] | 1st wire bond shear[4] [cN] | 2nd wire bond shear[4] [cN] | uniaxial cycling plastic strain 0.25% [Cycles to failure] | uniaxial cycling plastic strain 0.20% [Cycles to failure] | uniaxial cycling plastic strain 0.15% [Cycles to failure] | Power Cycling delta T = 70 K [Cycles to failure] | Power Cycling delta T = 135 K [Cycles to failure] | Electrical defects of chips after bonding |
|---|---|---|---|---|---|---|---|---|---|---|
| 7 | 49.3 | 1192.4 | 1223.3 | 1300.4 | | | | | | 0 |
| 8 | 48.5 | 1143.7 | 1087.4 | 1103.2 | | | | | | 0 |
| 9 | 51.6 | 1559.3 | 1411.5 | 1397.6 | | | | | | + |
| 10 | 51.5 | 1420.2 | 1480.4 | 1440.5 | | | | | | 0 |
| 11 | 51.3 | 1385.8 | 1367.1 | 1465.6 | 27'000 | 53'000 | 118'000 | 8'500'000 | 77'000 | + |
| 12 | 50.2 | 865.4 | 738.8 | 729.8 | | | | | | + |
| 13 | 44.9 | 1332.8 | 1801.5 | 1960.0 | | | | | | + |
| 14 | 46.7 | 1513.4 | 1920.7 | 2113.7 | | | | | | + |
| 15 | 56.8 | 2338.3 | 2681.4 | 2819.3 | | | | | | -- |
| 16 | 54.3 | 2014.7 | 2507.3 | 2693.8 | | | | | | - |
| Al-H11 CR | 37.2 | 955 | 1320 | 1352 | 8'700 | 12'400 | 27'700 | 380'000 | 21'000 | ++ |
| Al-H11 | 36.4 | 605.4 | 1237 | 1260.7 | | | | | | ++ |

[4]All failures were observed to fail in failure mode (2) - bond shearing.

We claim:

1. A wire (1) comprising:
a) a copper core (2) with a surface (15); and
b) a coating layer (3) superimposed over the surface (15) of the copper core (2),
wherein the coating layer (3) comprises aluminum,
a ratio of a thickness of the coating layer (3) to a diameter of the copper core (2) is in a range of from 0.05 to 0.2,
a ratio of a standard deviation of the diameter of the copper core (2) to the diameter of the copper core (2) is in a range of from 0.005 to 0.05,
a ratio of a standard deviation of the thickness of the coating layer (3) to the thickness of the coating layer (3) is in the range of from 0.05 to 0.4, and
wherein the wire has a diameter in a range of from 100 μm to 600 μm,
wherein an intermediate layer (7) is arranged between the copper core (2) and the coating layer (3), and
wherein the intermediate layer (7) comprises at least one intermetallic phase comprising a material of the core and a material of the coating layer,
wherein the intermediate layer (7) has a thickness in a range of from 0.5 to 5 μm,
the diameter of the core (2) of the wire (1) is in a range of from 150 to 500 μm, determined in a cross-sectional view of the wire (1), and
wherein the thickness of the coating layer (3) is in a range of from 20 to 60 μm, determined in a cross-sectional view of the wire (1).

2. The wire (1) according to claim 1, wherein the copper core comprises at least 95% by weight of copper with a purity of at least 99.9% based on the total weight of the copper core.

3. The wire (1) according to claim 1, wherein the coating layer comprises at least 80% by weight of aluminum with a purity of 99.9% based on the total weight of the coating layer.

4. The wire (1) according to claim 1, wherein a dissipated work is at least two times as high for the wire (1) than for a reference wire made from pure aluminum.

5. The wire (1) according to claim 1, wherein a maximum strain in a uniaxial cyclic test is at least 1.5 times as high for the wire (1) than for a reference wire made from pure aluminum.

6. The wire (1) according to claim 1, wherein a power cycling test is at least three times at high for the wire (1) than for a reference wire made from pure aluminum.

7. The wire (1) according to claim 1, wherein a wire pull of the wire (1) is at least 10% higher for the wire (1) than for a reference wire made from pure aluminum.

8. A process for manufacturing a wire (1), comprising at least the following steps:
a) providing a wire precursor (9) comprising a copper core (2) with a surface (15) and a coating layer (3) superimposed over the surface (15) of the copper core (2);
wherein the coating layer (3) comprises aluminum;
a ratio of a thickness of the coating layer (3) to a diameter of the copper core (2) is in a range of from 0.05 to 0.2;
a ratio of a standard deviation of the diameter of the copper core (2) to the diameter of the copper core (2) is in a range of from 0.005 to 0.05;
a ratio of a standard deviation of the thickness of the coating layer (3) to the thickness of the coating layer (3) is in the range of from 0.05 to 0.4; and
wherein the wire precursor (9) has a diameter in a range of from 0.5 to 5 mm;
b) shaping the wire precursor (9); and
c) annealing the wire precursor (9) to obtain the wire (1), wherein the wire (1) has a diameter in a range of from 100 μm to 600 μm,
wherein an intermediate layer (7) having a thickness in a range of from 0.5 to 5 μm is formed in step c), wherein the intermediate layer (7) is arranged between the copper core (2) and the coating layer (3) and comprises at least one intermetallic phase comprising a material of the core and a material of the coating layer,
the diameter of the core (2) of the wire (1) is in a range of from 150 to 500 μm, determined in a cross-sectional view of the wire (1), and
wherein the thickness of the coating layer (3) is in a range of from 20 to 60 μm, determined in a cross-sectional view of the wire (1).

9. The process according to claim 8, wherein the annealing is performed at a temperature in a range of from 140° C. to 400° C. over a period of from 30 minutes to 5 hours.

10. A wire (1) obtained by the process according to claim 8.

11. The wire (1) according to claim 10, wherein the wire (1) is characterized by at least one of the following features:
   a) a dissipated work is at least two times as high for the wire (1) than for a reference wire made from pure aluminum;
   b) a maximum strain in a uniaxial cyclic test is at least two times as high for the wire (1) than for a reference wire made from pure aluminum;
   c) a power cycling test is at least three times as high for the wire (1) than for a reference wire made from pure aluminum;
   d) a wire pull of the wire (1) is at least 10% higher for the wire (1) than for a reference wire made from pure aluminum;
   e) an electrical conductivity of the wire (1) is 20% to 55% higher than an electrical conductivity of a reference wire made from pure aluminum.

12. An electric device (10) comprising at least two elements (11) and at least a wire (1) according to claim 1, wherein the wire (1) electrically connects the two elements (11).

13. The electric device (10) of claim 12, wherein the electrical connection is obtained by wedge bonding.

14. The electric device (10) of claim 12, wherein at least one of the elements (11) is selected from the group consisting of a substrate, an integrated circuit, an IGBT (insulated gate bipolar transistor), a transistor, and a diode.

15. A propelled device (12) comprising at least one electric device (10) according to claim 12.

16. A process from making an electric device (10) comprising the steps of:
   a) providing at least two elements (10); and
   connecting the two elements (10) through a wire (1) according to claim 1, wherein at least one of the connections is performed by wedge bonding.

* * * * *